United States Patent
Cranston, III et al.

[11] Patent Number: 6,138,839
[45] Date of Patent: Oct. 31, 2000

[54] PIVOTED LATCHING BAR FOR RETAINING EXPANSION CARDS

[75] Inventors: William V. Cranston, III; John Easton McCloskey; James John Tout, Jr.; Frederick Charles Yentz, all of Boca Raton, Fla.

[73] Assignee: International Business Machines Corporation, Armonk, N.Y.

[21] Appl. No.: 09/152,048

[22] Filed: Sep. 11, 1998

[51] Int. Cl.[7] .................................................. A47G 19/08
[52] U.S. Cl. ...................................................... 211/41.17
[58] Field of Search ........................ 211/41.17; 361/801; 312/183, 223.2, 223.1, 902; 24/685 K, 68 T, 68 E, 311; 206/373

[56] References Cited

U.S. PATENT DOCUMENTS

| | | | |
|---|---|---|---|
| 5,129,613 | 7/1992 | Lloyd et al. | 248/221.3 |
| 5,317,483 | 5/1994 | Swindler | 361/801 |
| 5,439,108 | 8/1995 | Lackie | 206/373 |
| 5,526,555 | 6/1996 | Battistella et al. | 24/68 SK |
| 5,544,006 | 8/1996 | Radloff et al. | 361/683 |
| 5,575,546 | 11/1996 | Radloff | 312/183 |
| 5,601,349 | 2/1997 | Holt | 312/265.6 |
| 5,642,263 | 6/1997 | Lauruhn | 361/801 |
| 5,882,097 | 3/1999 | Kohagen et al. | 206/373 X |
| 5,967,466 | 10/1999 | Osborne et al. | 248/27.1 |

*Primary Examiner*—Daniel P. Stodola
*Assistant Examiner*—Erica B. Harris
*Attorney, Agent, or Firm*—Ronald V. Davidge; Richard A. Tomlin

[57] ABSTRACT

A card cage for holding expansion cards and filler panels within a computer system includes a ledge and a pivoted bar which is clamped in place adjacent to the ledge. A number of flexible portions of the pivoted bar clamp end portions of the filler panels and of brackets forming parts of the expansion cards against the ledge, so that these end portions are held in place while being electrically grounded. The bar is preferably pivoted about an axis extending parallel to the surface of the ledge and parallel to a slotted panel forming part of the card cage.

10 Claims, 2 Drawing Sheets

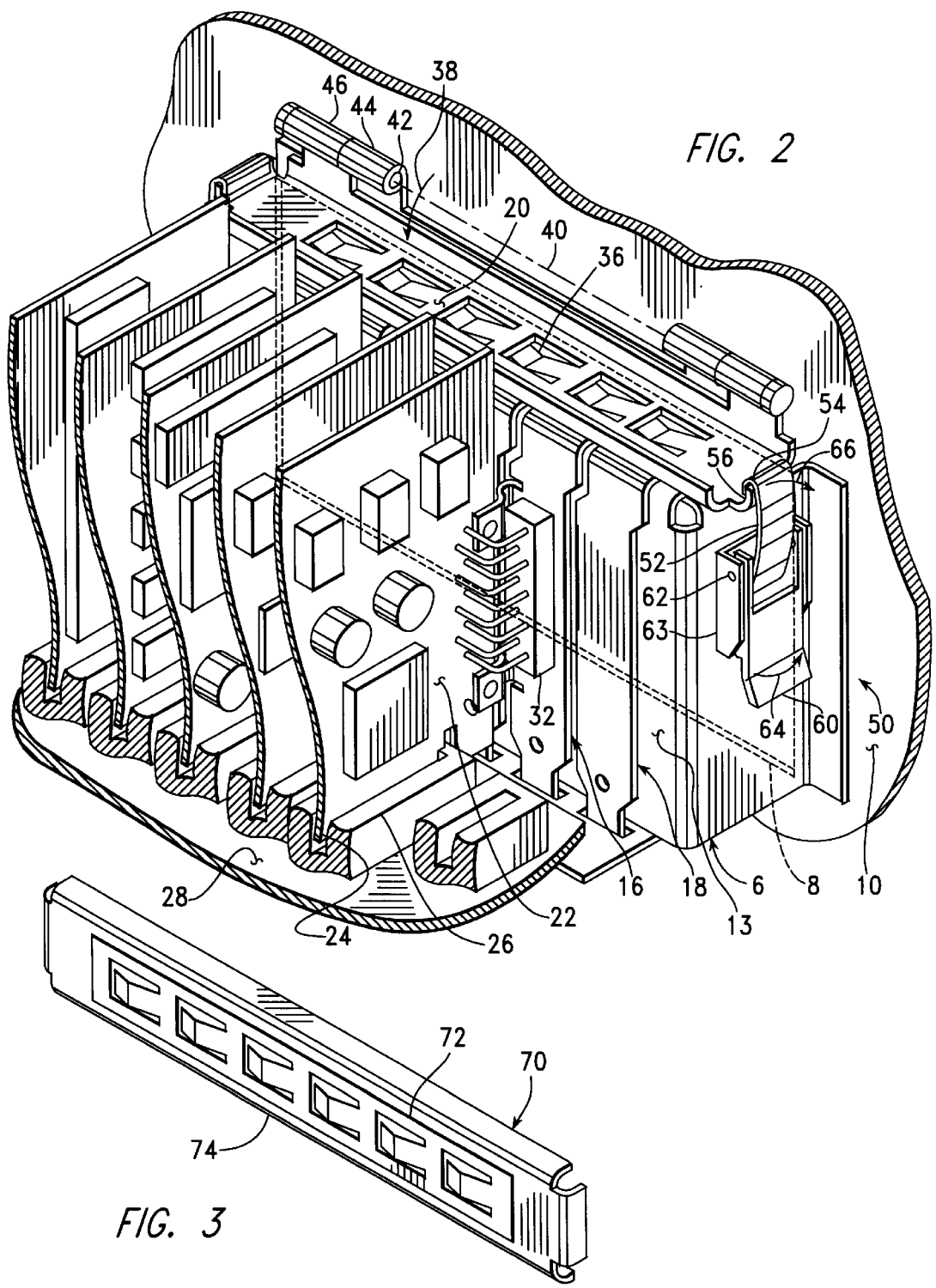

PIVOTED LATCHING BAR FOR RETAINING EXPANSION CARDS

BACKGROUND OF THE INVENTION

1. Field of the Invention

The present invention relates to providing means to hold and to electrically ground the metal bracket portions of conventional expansion card assemblies in place within a computing system, and, more particularly, to using a single latching bar for this purpose, so that the individual screws conventionally used are not required.

2. Background Information

A conventional computing system includes a number of positions, often called "slots," in which one or more expansion cards may be installed. These cards allow the flexible configuration of the system hardware, providing I/O functions, communication functions, etc. Signal and voltage lines are brought to each expansion card from a system bus through a number of bus connectors. The use of expansion cards in this way has become so widespread that several architectures, or electrical and mechanical configurations, have evolved. Of these, the most widespread have come to be called ISA (Industry Standard Architecture) and PCI (Peripheral Component Interconnect). This concept allows expansion cards from hundreds of manufacturers to be interchangeably used with computing systems from dozens of manufacturers.

In general, the expansion cards are individually plugged into a structure including a number of bus connectors aligned along a mother board, in alignment with a slotted card cage. There is one slot for each card position, together with a single connector, or with two or more connectors in axial alignment with one another on the mother board. Each expansion card includes a steel card bracket which fits inside the card cage, extending across a single slot. If the card has connectors for cables external to the system, these connectors are fastened to extend outward through an aperture in the card bracket, and hence through a slot in the card cage when the expansion card is installed in the system. Each card bracket includes an end portion turned outward to lie adjacent an inward extending portion of the card cage. Each card bracket is fastened into place using a single screw engaging this inward extending portion of the card cage through a slot within this outward turned end portion of the card bracket. This screw serves both to hold the expansion card in place, properly engaging the associated bus connector(s) and to electrically ground one end of the card as required for the maintenance of operation without excessive radio frequency emissions which may otherwise interfere with communication signals. This grounding location is often particularly important because of a need to ground cable shielding. At positions in the card cage in which an expansion card is not installed, filler panels having shapes similar to the card brackets are similarly installed to cover the slots internally. These filler panels also need to be electrically grounded to minimize radio frequency emissions.

While this configuration has gained wide acceptance, the use of a single, separate screw to hold each card bracket and each filler panel in place presents a number of problems. Since the use of expansion cards is intended to provide for easy reconfiguration of the computer system and for the expansion of its capabilities, such cards are often added or replaced by the system user. A typical problem occurring is the loss of the screw as a filler panel or expansion card is installed or removed. When a screw falls into the adjacent area, which is typically crowded with cards, cables, connectors, and other components, it is generally very difficult to find and retrieve. It must be retrieved in order to prevent a potentially damaging short circuit condition. In floor-standing computers, expansion cards are often replaced or added without disconnecting the various cables extending from the system, and therefore without moving the system off the floor. Such conditions make the removal and replacement of screws, and the retrieval of a screw in the event of a mishap, particularly difficult.

Many types of equipment, including computing equipment in other areas, have been configured to eliminate a need for using tools in areas where customer access is desirable. While the customer is expected to be able to install expansion cards, as evidenced by the fact that such cards are sold in boxes by computer stores, he must use a screwdriver to remove and reinstall the screws.

In the process of manufacturing a computer system, each slot in the card cage must be filled with either the bracket of an expansion card or with a filler panel. This means that a number of screws must be driven, increasing the time required for the assembly process.

Thus, what is needed is a method for holding expansion cards and filler panels in place in a card cage without requiring the use of a single screw for each card bracket and filler panel. Such a method should also provide for reliable electrical grounding between the card cage and the card bracket or filler panel. Furthermore, it is particularly desirable to facilitate the replacement of such cards and panels without requiring the use of a tool.

DESCRIPTION OF THE PRIOR ART

A number of alternative methods for holding expansion cards in place are described in the patent literature. For example, U.S. Pat. No. 5,317,483 describes the use of an elongated hold-down bar, pivoted at one end of the card cage, which is rotated downward into a position atop the outward-turned end of each card bracket or filler panel extending atop the inward-extending ledge of the card cage. The hold-down bar is held in its closed position by means of a single captive screw retained in the end of this bar opposite the end at which it is pivoted. While this method at least limits the motion of the card brackets to maintain alignment within the card cage, provision is not made to achieve electrical grounding at the outward-turned end of each card bracket when the dimensional variations of the various associated parts is considered. For example, it appears likely that a relatively thick card bracket on either side of a relatively thin card bracket could prevent electrical grounding of the thin card bracket, and that variations in the flatness of the hold-down bar and of the inward-extending ledge of the card cage could have a similar effect. Furthermore, while the use of a captive screw eliminates the problem of dropping a screw within the system, a screwdriver is still required to remove or install an expansion card.

U.S. Pat. No. 5,575,546 describes an apparatus in which the outward-turned end of each card bracket or filler bracket is prevented from motion along the surface of the inward-extending ledge of the card cage by means of tabs and posts extending upward from this ledge to engage features of the outward-turned ends. The apparatus also includes a locking member, which is shown as a molded plastic part holding two adjacent brackets in place. This locking member is slid downward above the outward-turned ends of the card brackets, with tabs of the locking member sliding within tabs formed as part of the card cage, and with a catch portion of the locking member snapping into a slot in the card cage.

Again, while this method limits movement of the card bracket, there is no positive mechanism for assuring that enough force is maintained between the card bracket and the card cage for electrical grounding. Also, while the use of a screwdriver is not required for the removal or installation of an expansion card or filler bracket, the problem of removing and reinstalling the locking members presents difficulties.

U.S. Pat. No. 5,601,349 describes the alternative use of a molded plastic retainer inserted into a hole in the system frame outwardly adjacent to the card cage. The retainer is pushed through the hole and rotated into place to hold the outward-turned end of a single card bracket or filler panel. The retainer is configured to provide a retaining force from the wall of the frame to the card bracket or filler panel. This retaining force can be expected to maintain electrical grounding between the outward-turned end of the card bracket or filler panel and the card cage, and the installation process does not require the use of a screwdriver. However, the use of a single retainer for each expansion card or filler panel, with the retainers being loose parts during the removal and installation of the expansion card or filler panel, presents some problems which are similar to those associated with the use of individual screws.

Thus, what is needed is apparatus for retaining the brackets of expansion cards and filler panels in place within a card cage and for maintaining electrical ground between the outward-turned ends of each card bracket or filler panel and the adjacent inward-extending ledge of the card cage, with such apparatus being a single member movable between a closed position, in which all expansion cards and filler panels are properly retained, and an open position, in which all expansions cards and filler brackets are released for removal. It is further desirable that the single member remains as a part of the computing system during this process of removal and installation.

SUMMARY OF THE INVENTION

In accordance with a first aspect of the invention, there is provided a card cage for holding card brackets and filler panels to extend within a machine frame adjacent an aperture in the machine frame. Each of the card brackets and each of the filler panels includes an outward-extending end portion. The card cage includes a slotted panel, a ledge, and a bar. The slotted panel has a number of slots and extends adjacent the aperture in the machine frame and offset inward from the machine frame. The ledge extends inward to the slotted panel from the machine frame. The bar, which extends adjacent the ledge, includes a number of flexible portions, and is movable between a closed position in which the individual flexible portions individually hold each of the outward-extending portions installed along the ledge against the ledge, and an open position in which the bar releases the outward-extending portions installed along the ledge for removal from the ledge.

BRIEF DESCRIPTION OF THE DRAWINGS

FIG. 2 is an isometric view of the card cage of FIG. 1, including the bracket retaining bar thereof in a closed position; and FIG. 3 is an isometric view of an alternate version of the bracket retaining bar of FIG. 1, in which a separate spring member fastened to a bar structure is used to provide grounding forces.

DETAILED DESCRIPTION

Figure 1:
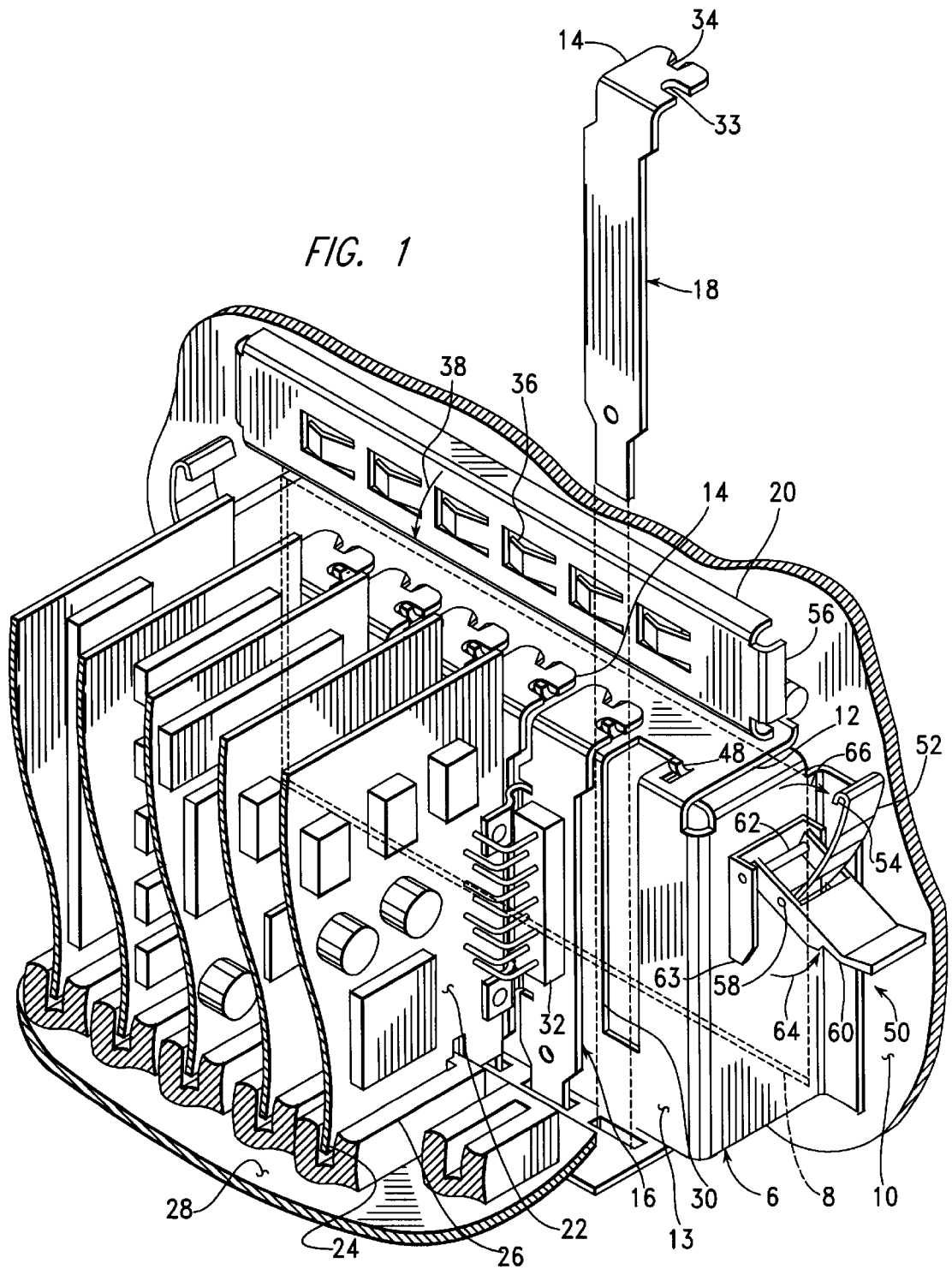
FIG. 1 is an isometric view of a card cage built in accordance with the present invention, including a bracket retaining bar in an open position, together with a number of expansion cards and filler panels, one of which is shown in an exploded relationship with the card cage.

Referring initially to FIG. 1, a card cage 6, built in accordance with the present invention, extends inward from an aperture 8 within an outer frame 10 of a computing system. The card cage 6 includes a ledge 12 extending inward between the outer frame 10 and a slotted panel 13. A number of outward-extending upper ends 14 of card brackets 16 and filler panels 18 are held on the ledge 12 by a pivoting latching bar 20, shown in its open position. Each card bracket 16 forms part of an expansion card 22, which also includes a tab 24 plugged into a bus connector 26. A number of bus connectors 26 extend from a mother board 28, being individually aligned with slots 30 in the card cage 6, so that the tab 24 of an expansion card 22 extends into a bus connector 26 while a connector 32, extending through the card bracket 16, also extends outward through the associated slot 30.

The card brackets 16 and filler panels 18 are conventional, each including a slot 33 for screw attachment to a conventional card cage (not shown), and each including a pair of downward-formed points 34, which provide improved electrical grounding when the outward-extending upper end 14 is clamped in place on the inward-extending ledge 12.

Referring to FIG. 2, and continuing to refer to FIG. 1, the latching bar 20 includes a number of inward-formed cantilever portions 36, which contact the individual outward-extending upper ends 14 of card brackets 16 and filler panels 18 when the latching bar 20 is closed by pivoting in the direction of arrow 38 around a pivot axis 40. This pivot axis 40, which is parallel to the surfaces of both the ledge 12, and the slotted panel 13, is established by a pair of hinge pins 42 extending between tabs 44 of the card cage 6 and tabs 46 of the latching bar 20. Mounting the latching bar 20 to pivot in this way achieves advantages, when compared to the pivoting direction of U.S. Pat. No. 5,317,483, of more easily providing a rigid 'structure to press on all upper ends 14, and of not taking up as much space when the bar is opened.

The card cage 6 also includes an alignment tab 48 extending from the inward-extending ledge 12 to engage the slot 33 of each outward-extending upper end 14, replacing an alignment function conventionally achieved through the use of a mounting screw.

The latching bar 20 is held in its closed position, as shown in FIG. 2, by means of a clamp 50 at each end. Each clamp 50 includes a link 52 having a hook-shaped end 54 which engages a tab 56 of the latching bar 20. The opposite end of link 52 is pivoted at a pin 58 within an actuation lever 60. The actuation lever 60 is in turn pivoted at a pin 62 extending through a clamp housing bracket 63. With the latching bar 20 and the clamp 50 in the closed position of FIG. 2, link 52 is stretched between the tab 56 and the pin 58. The resulting clamping of the latching bar 20 develops a normal force between each cantilever portion 36 of the latching bar 20 and the individual outward-extending end 14 of an underlying card bracket 16 or filler panel 18. This normal force maintains proper electrical grounding between the outward-extending end 14 and the inward-extending ledge 12 of the card bracket 6. Because of the individual flexibility of the cantilever portions 36, a suitable normal force, capable of maintaining satisfactory electrical grounding is maintained at each cantilever portion 36, despite variations in the size and shape of the associated elements.

To release the clamps 50, the actuation lever 60 of each clamp 50 is manually pivoted in the direction of arrow 64.

As the lever 60 is rotated into the open position of FIG. 1, the motion of pin 58 causes the hook-shaped end 54 of link 52 to disengage from its tab 56. The link 52 is then manually pivoted outward, in the direction of arrow 66 to clear the associated tab 56 of the latching bar 20, and the latching bar is pivoted open opposite the direction of arrow 38. At this point, any of the expansion cards 22 and the filler panels 18 may be removed and replaced.

Referring to FIG. 3, an alternative latching bar 70 includes a relatively thin cantilever element 72 spot welded to a relatively thick bar element 74. This method allows the use of a more flexible material (due to thinness) while the overall stiffness of the latching bar 70 is maintained using the thick material for element 74.

While FIGS. 1 and 2 show a clamp 50 at each end of the latching bar 20, in some instances only one clamp 50, at one end of the latching bar 20, is required. A need for a clamp at each end of the latching bar 20 depends particularly on the length of the latching bar 20.

What is claimed is:

1. A card cage for holding card brackets and filler panels to extend within a machine frame adjacent an aperture in said machine frame, with each of said card brackets and each of said filler panels including an outward-extending end portion, wherein said card cage comprises:

a slotted panel, including a plurality of slots, adjacent said aperture in said machine frame, and offset inward from said machine frame;

a ledge having a first side, said ledge extending inward to said slotted panel from said machine frame; and a bar pivotally connected to said first side of said ledge, including a plurality of flexible portions, wherein said bar is movable between a closed position in which said flexible portions individually hold each said outward-extending portion installed along said ledge against said ledge, maintaining electrical grounding between each said outward-extending portion and said ledge, and an open position in which said bar releases said outward-extending portions installed along said ledge for removal from said ledge.

2. The card cage of claim 1, additionally comprising a first clamp adjacent a first end of said bar, wherein said first clamp is movable between a first position in which said bar is held in said closed position and a second position in which said bar is released from said closed position to be moved into said open position.

3. The card cage of claim 2, wherein said first clamp includes:

an actuation lever pivotally mounted on said card cage; and a link pivotally mounted on said actuation lever, having a hook extending around an end of said bar with said bar in said closed position and with said first clamp in said first position, wherein said hook releases said end of said bar as said actuation lever is pivoted to move said first clamp from said first position into said second position.

4. The card cage of claim 2, additionally comprising a second clamp adjacent a second end of said bar, wherein said second clamp is movable between a third position in which said bar is held in said closed position and a fourth position in which said bar is released from said closed position to be moved into said open position.

5. The card cage of claim 1, additionally comprising a tab extending outward from said ledge for holding each said outward-extending end in a predetermined alignment on said ledge.

6. A card cage for holding card brackets and filler panels to extend within a machine frame adjacent an aperture in said machine frame, with each of said card brackets and each of said filler panels including an outward-extending end portion, wherein said card cage comprises:

a slotted panel, including a plurality of slots, adjacent said aperture in said machine frame, and offset inward from said machine frame;

a ledge having a first side, said ledge extending inward to said slotted panel from said machine frame; and a bar pivotally connected to said first side of said ledge, mounted to pivot about an axis extending parallel to surfaces of said slotted panel and said ledge, wherein said bar is movable between a closed position in which said bar holds each said outward-extending portion installed along said ledge against said ledge, maintaining electrical grounding between each said outward-extending portion and said ledge, and an open position in which said bar releases said outward-extending portions installed along said lodge for removal from said ledge.

7. The card cage of claim 6, additionally comprising a first clamp adjacent a first end of said bar, wherein said first clamp is movable between a first position in which said bar is held in said closed position and a second position in which said bar is released from said closed position to be moved into said open position.

8. The card cage of claim 7, wherein said first clamp includes:

an actuation lever pivotally mounted on said card cage; and a link pivotally mounted on said actuation lever, having a hook extending around an end of said bar with said bar in said closed position and with said first clamp in said first position, wherein said hook releases said end of said bar as said actuation lever is pivoted to move said first clamp from said first position into said second position.

9. The card cage of claim 6, additionally comprising a second clamp adjacent a second end of said bar, wherein said second clamp is movable between a third position in which said bar is held in said closed position and a fourth position in which said bar is released from said closed position to be moved into said open position.

10. The card cage of claim 6, additionally comprising a tab extending outward from said ledge for holding each said outward-extending end in a predetermined alignment on said ledge.

* * * * *